United States Patent [19]

Chu

[11] Patent Number: 5,310,055
[45] Date of Patent: May 10, 1994

[54] MAGAZINE AND SHIPPING TRAY FOR LEAD FRAMES

[75] Inventor: Hsiang Chu, San Jose, Calif.

[73] Assignee: National Semiconductor Corporation, Santa Clara, Calif.

[21] Appl. No.: 37,516

[22] Filed: Mar. 24, 1993

Related U.S. Application Data

[63] Continuation of Ser. No. 899,828, Jun. 16, 1992, abandoned, which is a continuation of Ser. No. 571,377, Aug. 21, 1990, abandoned.

[51] Int. Cl.⁵ ............................................. B65D 85/30
[52] U.S. Cl. .................................. 206/328; 206/334; 206/449
[58] Field of Search .................. 206/328, 330–332, 206/334, 449, 499, 815; 437/206, 207, 211; 29/740–743, 827; 174/52.4

[56] References Cited

U.S. PATENT DOCUMENTS

| | | | |
|---|---|---|---|
| 1,276,326 | 8/1918 | Casper | 206/815 X |
| 1,740,424 | 12/1929 | Blaine | 206/449 |
| 2,607,594 | 8/1952 | Rubinoff | 206/449 X |
| 3,360,258 | 12/1967 | Nix | 206/449 X |
| 3,469,684 | 9/1969 | Keady et al. | 206/330 |
| 3,691,289 | 9/1972 | Rohloff | 206/330 X |
| 4,043,485 | 8/1977 | Tippetts | 206/499 X |
| 4,457,662 | 7/1984 | Ireland et al. | 29/743 X |
| 4,483,441 | 11/1984 | Akizawa et al. | 206/328 |
| 4,683,644 | 8/1987 | Tange et al. | 437/211 X |
| 4,798,305 | 1/1989 | Laverty | 206/334 X |
| 5,012,925 | 5/1991 | Gallagher, Sr. | 206/332 |
| 5,076,204 | 12/1991 | Hisamune | 118/719 |
| 5,125,509 | 6/1992 | Takei et al. | 206/332 |

FOREIGN PATENT DOCUMENTS 322103 7/1957 Switzerland ....................... 206/539

OTHER PUBLICATIONS

IBM Technical Disclosure Bulletin, vol. 23 No. 7A Dec. 1980.

Primary Examiner—Bryon P. Gehman
Attorney, Agent, or Firm—Limbach & Limbach

[57] ABSTRACT

A combination magazine and shipping tray for lead frames cut into discrete length strips. The magazine collects discrete length lead frame strips dispensed from an automated lead frame quality inspection machine. A cover, when placed over the magazine, provides a packaging tray for shipment of the collected lead frame strips to a semiconductor integrated circuit packaging facility. At the packaging facility, the cover is removed and the magazine is a loading magazine for loading discrete length lead frame strips into a machine used for packaging ICs.

12 Claims, 7 Drawing Sheets

MAGAZINE AND SHIPPING TRAY FOR LEAD FRAMES

This is a continuation of co-pending application Ser. No. 07/899,828, filed on Jun. 16, 1992, now abandoned, which was a continuation of application Ser. No. 07/571,377, filed on Aug. 21, 1990, also now abandoned.

BACKGROUND OF THE INVENTION

1. Field of the Invention

The present invention relates to a combination magazine and shipping tray for lead frames cut into discrete length strips.

2. Description of the Prior Art

Lead frames are used in the packaging of semiconductor integrated circuits (ICs). Referring to FIG. 1, a discrete length strip of lead frames according to the prior art is shown. The discrete length strip 10 includes a plurality of lead frames 12 mechanically connected by a frame 14. Each lead frame 12 includes a plurality of leads 16 and a die pad area 18. With high lead count lead frames, a tape 20 may be applied across the leads 14 to prevent bending or displacement of the leads 16. The die pad area 18 is usually downset from the plane defined by the leads 16 so that when a die is placed on the pad area 18, it is substantially co-planar with the leads 16 of a lead frame 12. A plurality of indexing holes 22 in the frame 14 are used for indexing the discrete length strip 10 through machines used to package ICs. The discrete length strips 10 (hereafter "discrete strips") generally contain from 5 to 20 lead frames 12 per discrete strip 10, depending on the size of the individual lead frames 12.

Discrete strips 10 are mass produced from a long narrow strip of metal, such as copper or "alloy 42", which is selectively stamped. Each stamp forms a pattern of a lead frame 12 with the leads 16 and the die pad area 18. The peripheral regions of the strip of metal form the frame 14 which holds the individual lead frames 12 together. The strip of lead frames 12 is usually rolled onto a reel, and spot plated in a reel to reel selective plating system. For examples of a selective plating system, see U.S. Pat. Nos. 3,746,630 and 3,723,283, which are assigned to the assignee of the present invention. In subsequent steps, the tape 20 may be applied to the leads 16 and the die area 18 may be downset. The long selectively plated strip of lead frames is then cut into the discrete strips 10, as illustrated in FIG. 1.

The machines used to package integrated circuits are designed to operate on a lead frame 12 in the form of a discrete strip 10. In the packaging of semiconductor devices, a discrete strip 10 is loaded into a series of packaging machines to complete the packaging of the ICs. First, the discrete strip 10 is fed into a die attach machine where a die is fixed to each of the die pad areas 18. In a bonding machine, the leads 16 are electrically bonded to the die of each lead frame 12. In an encapsulation machine, the leads 16 and die of each lead frame 12 are then encapsulated in a packaging material, such as plastic or ceramic. The individual packages are then excised from the frame 14 of the discrete strip 10 to complete the IC packaging process.

Prior to shipment of the lead frames to a packaging facility, the discrete strips 10 are inspected for defects. Referring to FIG. 2, a block diagram of a lead frame quality inspection station, such as Model No. Spectra 2000 manufactured by Electrical Plating Engineering Company, is shown. The station 30 includes an automatic quality inspection machine 32, a conveyor 34 including a plurality of rollers 36A and 36B for conveying discrete strips 10, a reject bin 38, an accept bin 40, an unload elevator 42 positioned inside the accept bin 40, an optical sensor 43 and a packaging tray 44.

The rollers 36A and 36B operate independent of one another, but both under the control of the inspection machine 32. In response to a signal from inspection machine 32, the rollers 36A may be horizontally withdrawn from their normal operating position. As a result, a discrete strip 10 on the rollers 36A is dropped into the reject bin 38. Similarly, in response to another signal from the inspection machine 32, the rollers 36B may be horizontally withdrawn from their normal operating position. As a result, a discrete strip 10 on the rollers 36B is dropped into the accept bin 40.

During operation, discrete strips 10 are fed into the inspection machine 32 where they are inspected for defects. The inspected discrete strips 10 are placed onto conveyor 34 where they are conveyed toward the accept bin 40. If a discrete strip 10 is defective, however, the inspection machine 32 transmits a control signal to the rollers 36A. The defective discrete strip 10 is then dropped into and discarded in the reject bin 38 before it reaches the accept bin 40. Alternatively, if a discrete strip 10 passes inspection the inspection machine 32 directs the discrete strip 10 to be conveyed beyond the reject bin 38. At the accept bin 40, the inspection machine 32 transmits a control signal to the rollers 36B and the discrete strips 10 fall onto the unload elevator 42 in the accept bin 40.

As the discrete strips 10 accumulate into the accept bin 40, the unload elevator gradually descends. The optical sensor 43 determines the number of discrete strips 10 in the accept bin. Once a predetermined number of discrete strips 10 are accumulated in the accept bin 40, for example one hundred, the inspection machine 32 is shut off. The discrete strips 10 are then manually removed from the unload elevator 42, bundled, wrapped in paper, and placed by hand into the packaging tray 44.

A complete description of the packaging tray 44 is described in U.S. Pat. No. 4,798,305, entitled "Adjustable Shipping Tray", and is assigned to the assignee of the present invention. The adjustable shipping tray 44 provides a flat bottom, two sets of opposing vertical sides and an open top. Within the tray, one or more movable partitions are provided to allow the internal compartment of the tray to accommodate the bundles of lead frames of different sizes and configuration.

The prior art method of manually removing, wrapping and packing bundles of discrete strips 10 into the adjustable tray 44 has a number of deficiencies. First, manual handling of the lead frames may cause physical damage to the delicate discrete strip 10. The plated surfaces of lead frames may become scratched, leads 16 may be displaced, or the discrete strip 10 may be bent if mishandled. Second, the surface area of the lead frames 12 may be contaminated if the person manually handling the lead frames has dirty hands.

SUMMARY OF THE INVENTION

The present invention is a combination magazine and shipping tray for lead frames cut into discrete length strips.

The present invention provides a magazine for automatically collecting discrete length lead frame strips dispensed from an automated lead frame quality inspection machine. The magazine includes a cover, which when placed over the magazine, provides a packaging tray for shipment of the collected lead frame strips to an IC packaging facility. At the packaging facility, the cover is removed and the magazine can be used as a loading magazine for automatically loading the discrete length lead frame strips into a machine used for packaging the ICs.

The combination magazine and shipping tray of the present invention eliminates the problems associated with the prior art. Namely, it permits the automation of the loading and unloading of discrete strips of lead frames. Thus, the problems of contamination and physical damage to the lead frames are avoided.

DESCRIPTION OF THE PREFERRED EMBODIMENT

Figure 1:
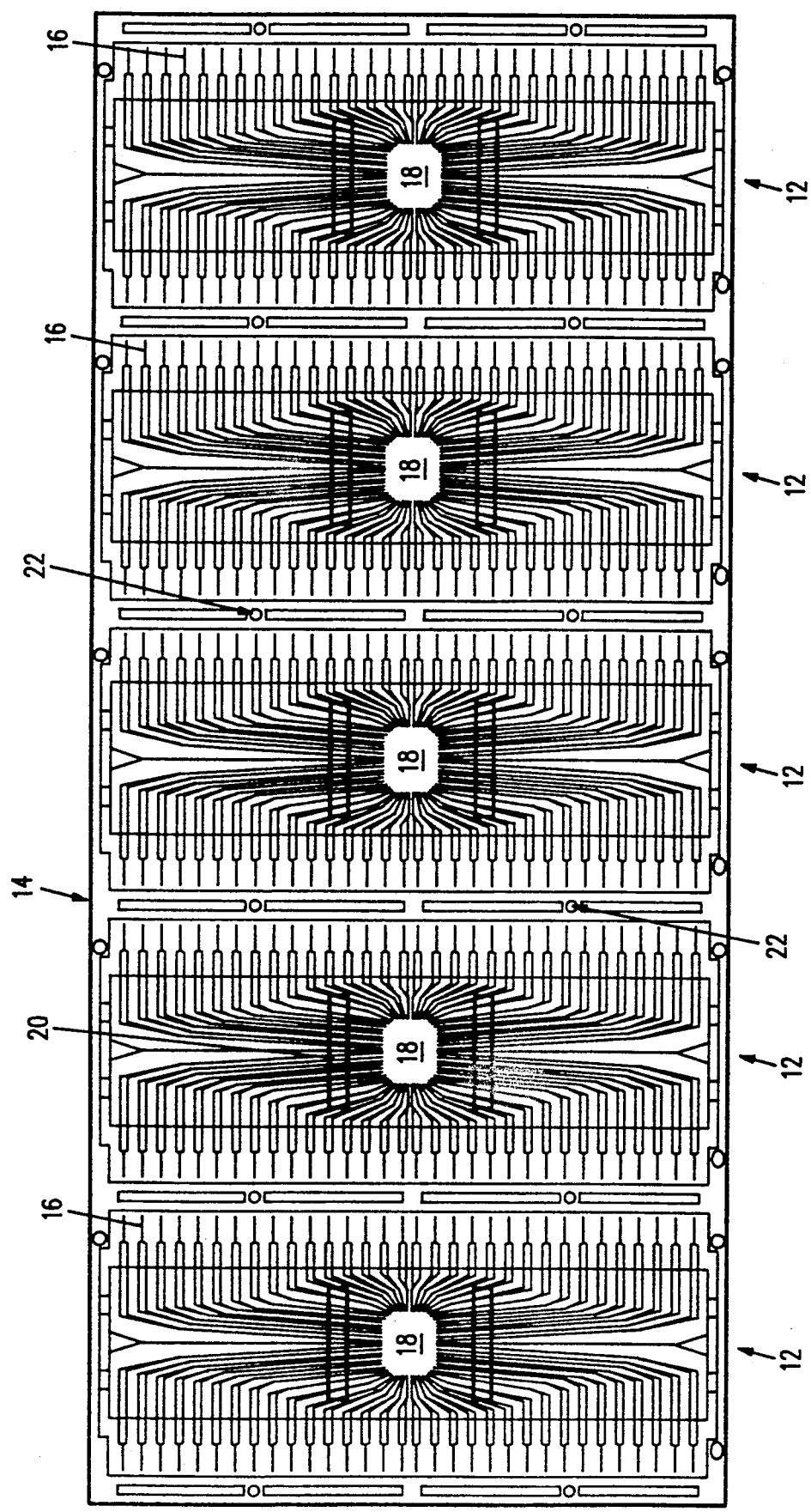
FIG. 1 is a discrete length strip of lead frames according to the prior art.
Figure 2:
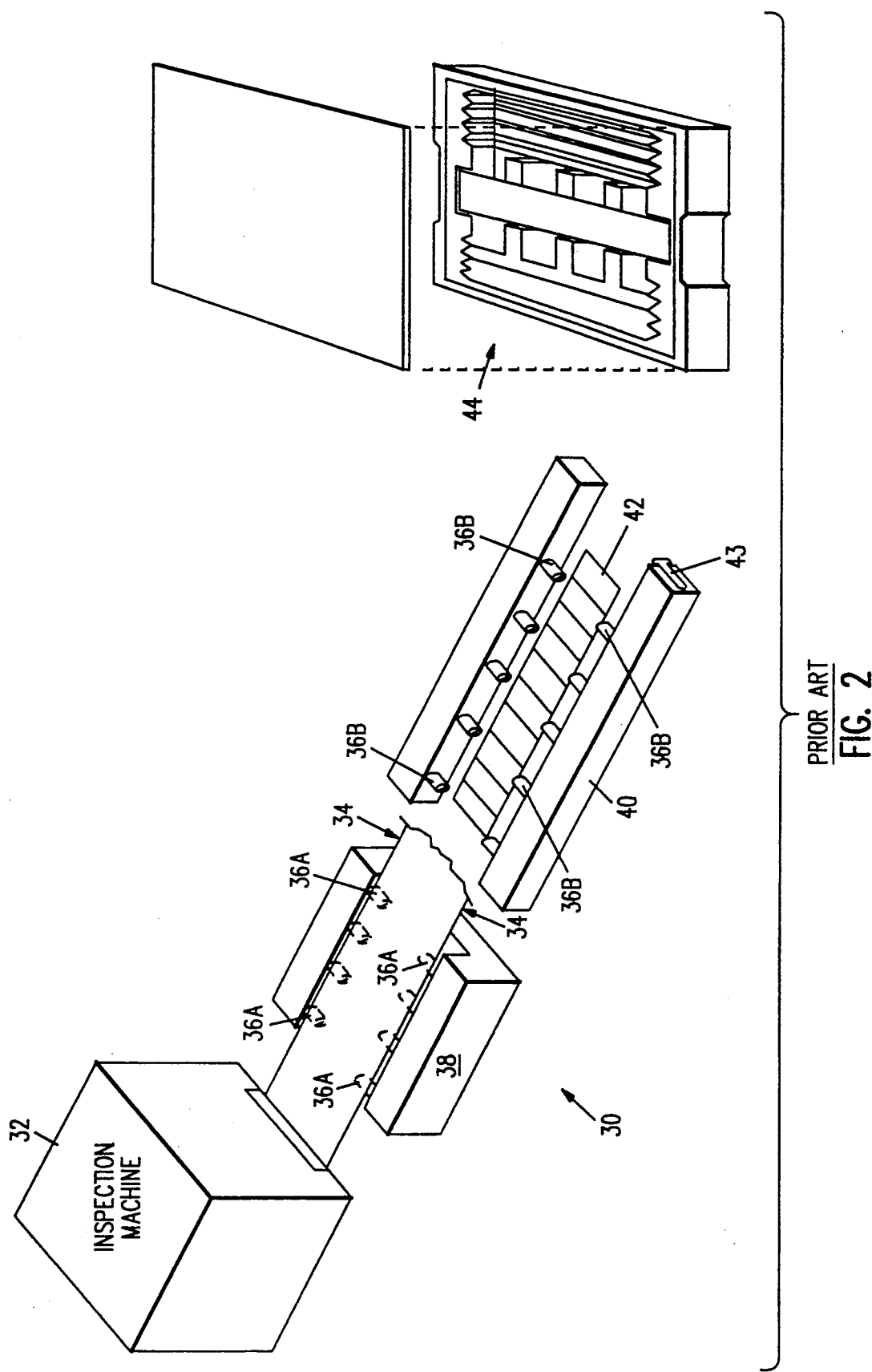
FIG. 2 is a perspective view of a lead frame quality inspection station according to the prior art.
Figure 3:
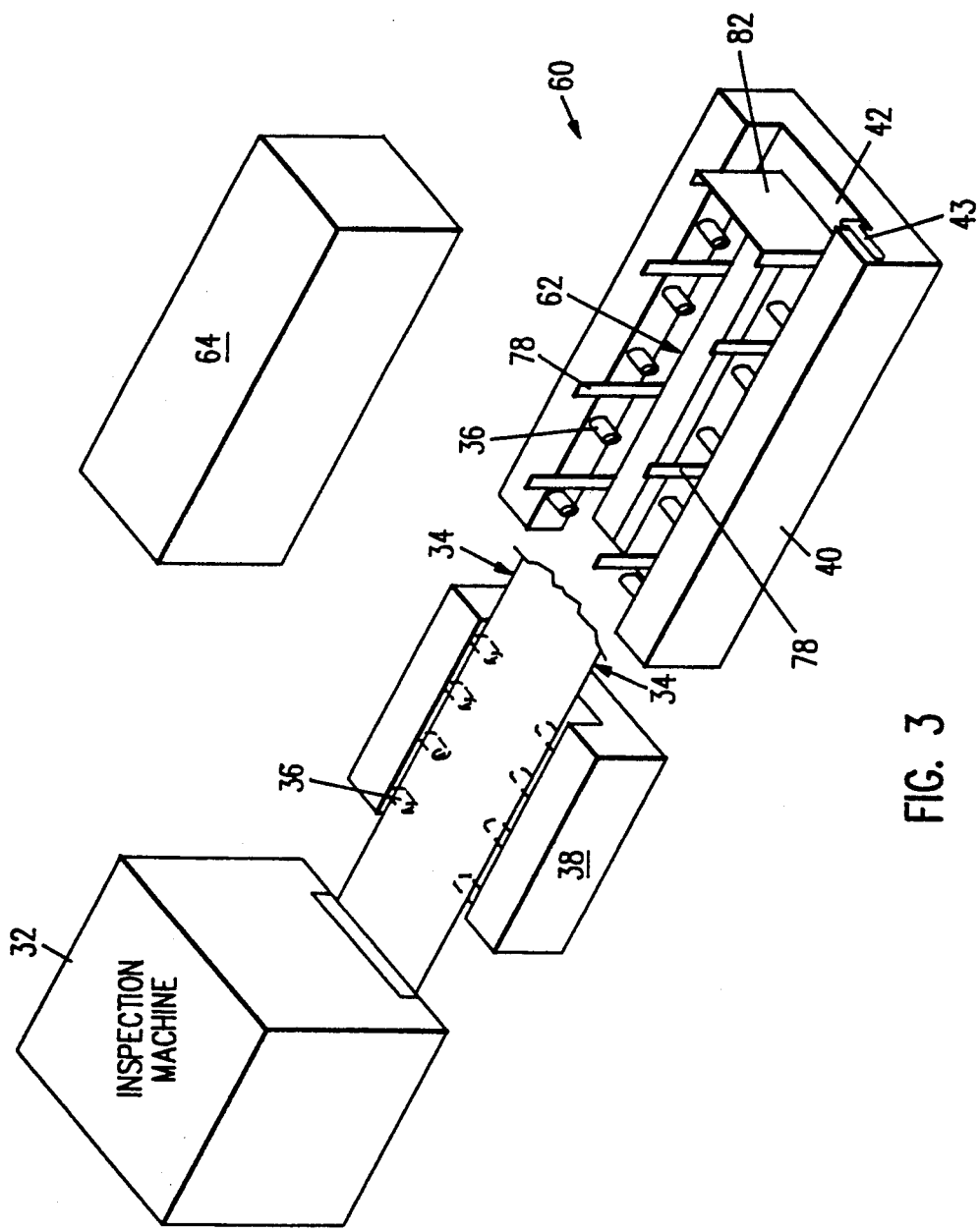
FIG. 3 is a perspective view of a lead frame magazine and cover according to the present invention fitted into the lead frame inspection station of FIG. 2.

Referring to FIG. 3, a perspective view of a combination magazine and cover according to the present invention is shown fitted into the lead frame inspection station of FIG. 2. The combination magazine and shipping tray 60 includes a magazine 62 and a cover 64. The magazine 62 is designed to be positioned within the accept bin 40 on the support elevator 42. The elements which perform the same or similar functions as described with reference to FIGS. 1 and 2 are indicated by the same reference numerals in FIG. 3.

During operation of the inspection machine 32, rejected discrete strips 10 are deposited into the reject bin 38 in the same manner as described above. Acceptable discrete strips 10, however, are dropped directly into the magazine 62 and not onto the unload elevator 42. As the discrete strips 10 accumulate into the magazine 62, the magazine resting on the unload elevator 42 gradually descends. The optical sensor 43 determines the number of discrete strips 10 in the magazine 62. Once a predetermined number of discrete strips 10, for example one hundred, are accumulated in the magazine 62, the magazine is removed from the accept bin 40. The cover 64 is then placed over the magazine 62, thus providing a packaging tray for shipping lead frames to a semiconductor integrated circuit packaging facility.

Figure 4:
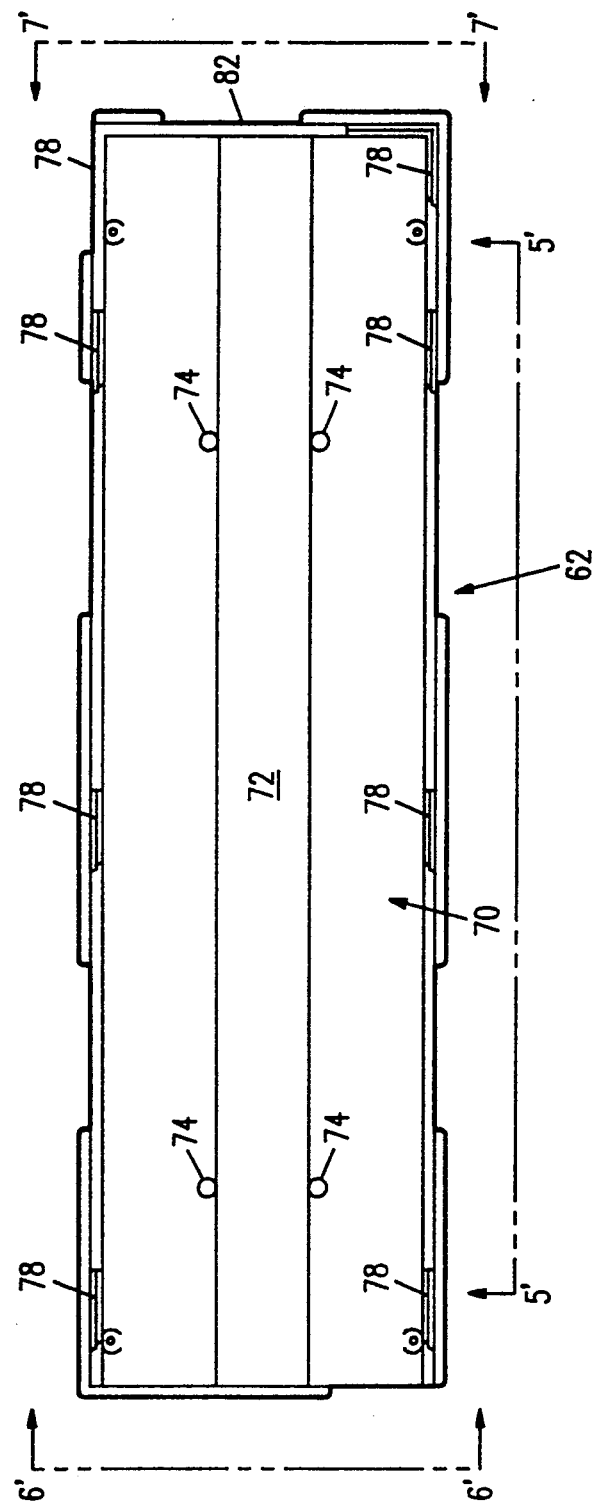
FIG. 4 is a top view of the lead frame magazine according to the present invention.

Referring to FIG. 4, a top view of the lead frame magazine is shown. The magazine 62 includes a base 70 forming the bottom surface of the magazine 62. A recess region 72, running the length of the base 70, accommodates the recessed die pad areas 18 of the discrete strips 10 when they are resting in the magazine 62. A plurality of holes 74 are positioned within the base 70 of the magazine. In a preferred embodiment of the present invention, the holes 74 are positioned to lie directly underneath the index holes 22 in the frame 14 when a discrete strip 10 is inside the magazine.

Figure 5:
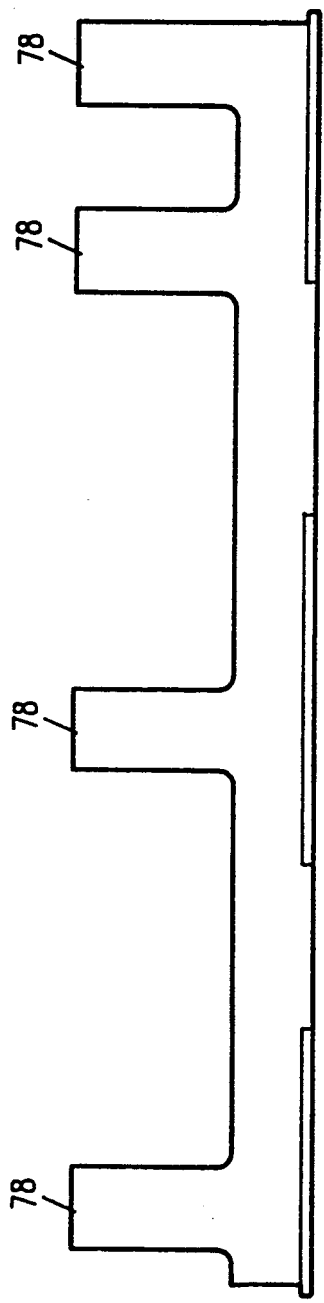
FIG. 5 is a side view of the lead frame magazine taken along lines 5'—5' of FIG. 4 according to the present invention.

Referring to FIG. 5, a side view along lines 5'—5' of FIG. 4 of the magazine 62 is shown. Each side of magazine 62 includes a plurality of posts 78 which extend upward from the base 70 of the magazine. The posts 78 are positioned so that when the magazine 62 is properly positioned inside the accept bin 40, the posts 78 do not interfere with the operation or horizontal movement of the rollers 36B of conveyer 34.

Figure 6:
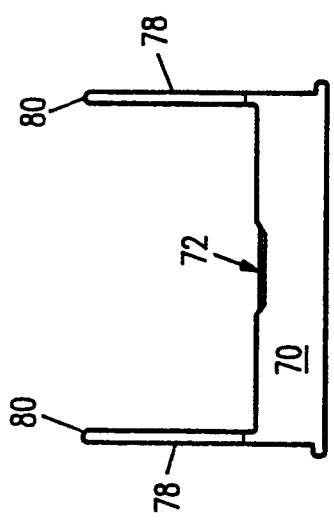
FIG. 6 is a front a view of the lead frame magazine taken along lines 6'—6' of FIG. 5 according to the present invention.

Referring to FIG. 6, a front view along the lines 6'—6' of FIG. 4 of the magazine 62 is shown. The front view of the magazine 62 shows base 70, recess region 72 and posts 78. The front of the magazine 62 is open to readily accept the discrete strips 10 which are dropped into the magazine 62 from the conveyer 34. The upper inner regions 80 of the posts 78 are sloped to facilitate and guide the discrete strips 10 into the magazine 62 as they fall from the conveyer 36.

Figure 7:
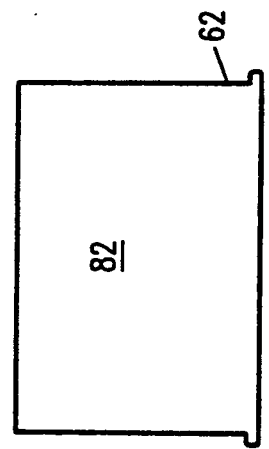
FIG. 7 is a back view of the lead frame magazine taken along lines 7'—7' according to the present invention.

Referring to FIG. 7, a back view along the line 7'—7' of FIG. 4 is shown. The back of magazine 62 includes a back wall 82.

Figure 8:
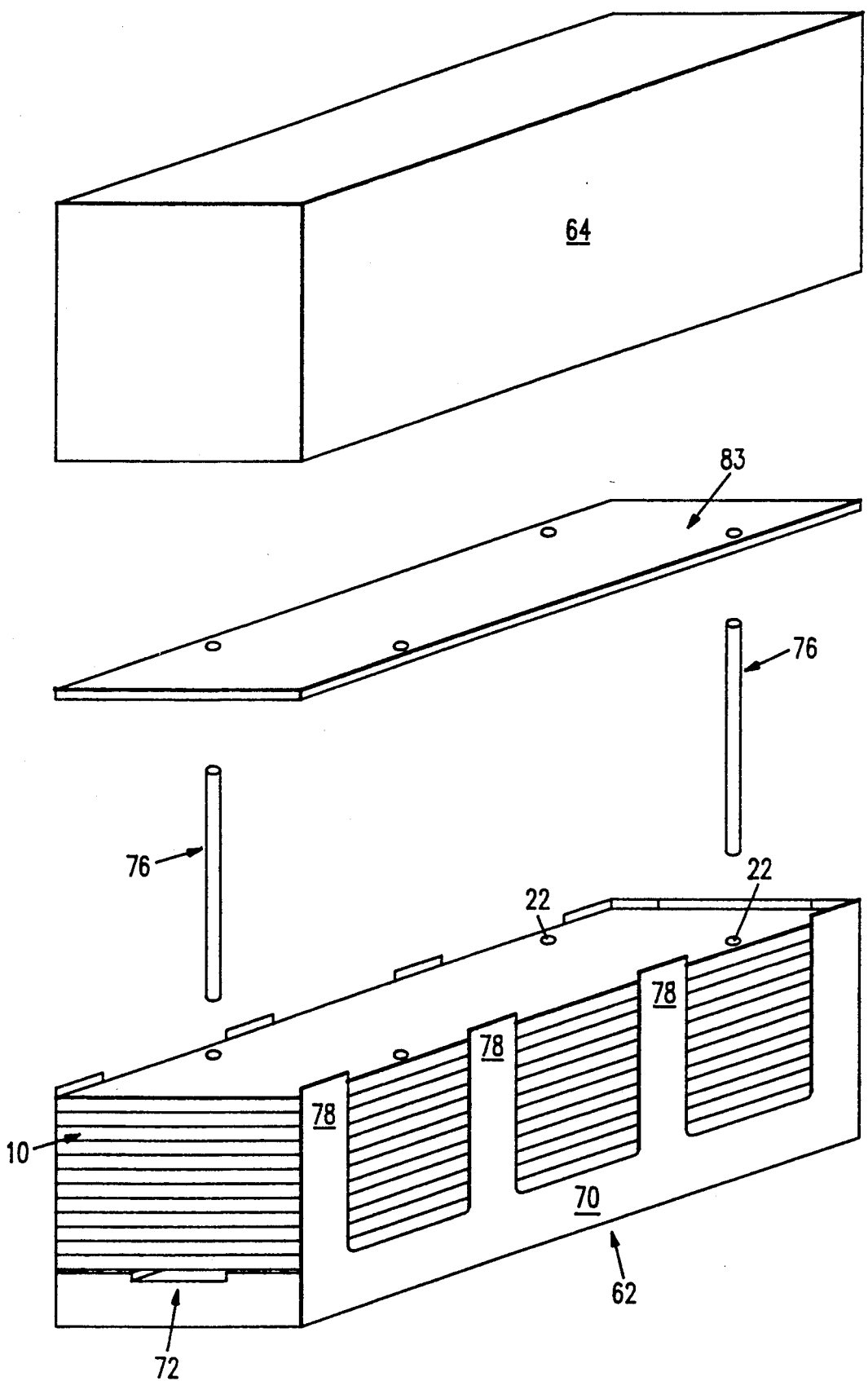
FIG. 8 is a perspective view of the magazine cover and magazine filled with discrete strips according to the present invention.

Referring to FIG. 8, a magazine 62 and cover 64 are shown removed from the accept bin 40 of an inspection machine 32. After the predetermined number of discrete strips 10 have been collected in the magazine 62, the magazine is removed from the accept bin 40. In a preferred embodiment, a pin 76 is inserted into the index holes 22 of the frame 14 in the discrete strips 10 in the magazine and through the hole 74 of the base 70. The pin 76 prevents the discrete strips 10 from movement inside the magazine 62 during shipment. In a preferred embodiment, a shield 83 is placed over the top discrete strip 10 in the magazine. The shield 83 protects the discrete strips from contamination and oxidation. Prior to shipment, the cover 64 is placed over the magazine 62 thereby providing a packaging tray for the discrete strips 10.

Figure 9:
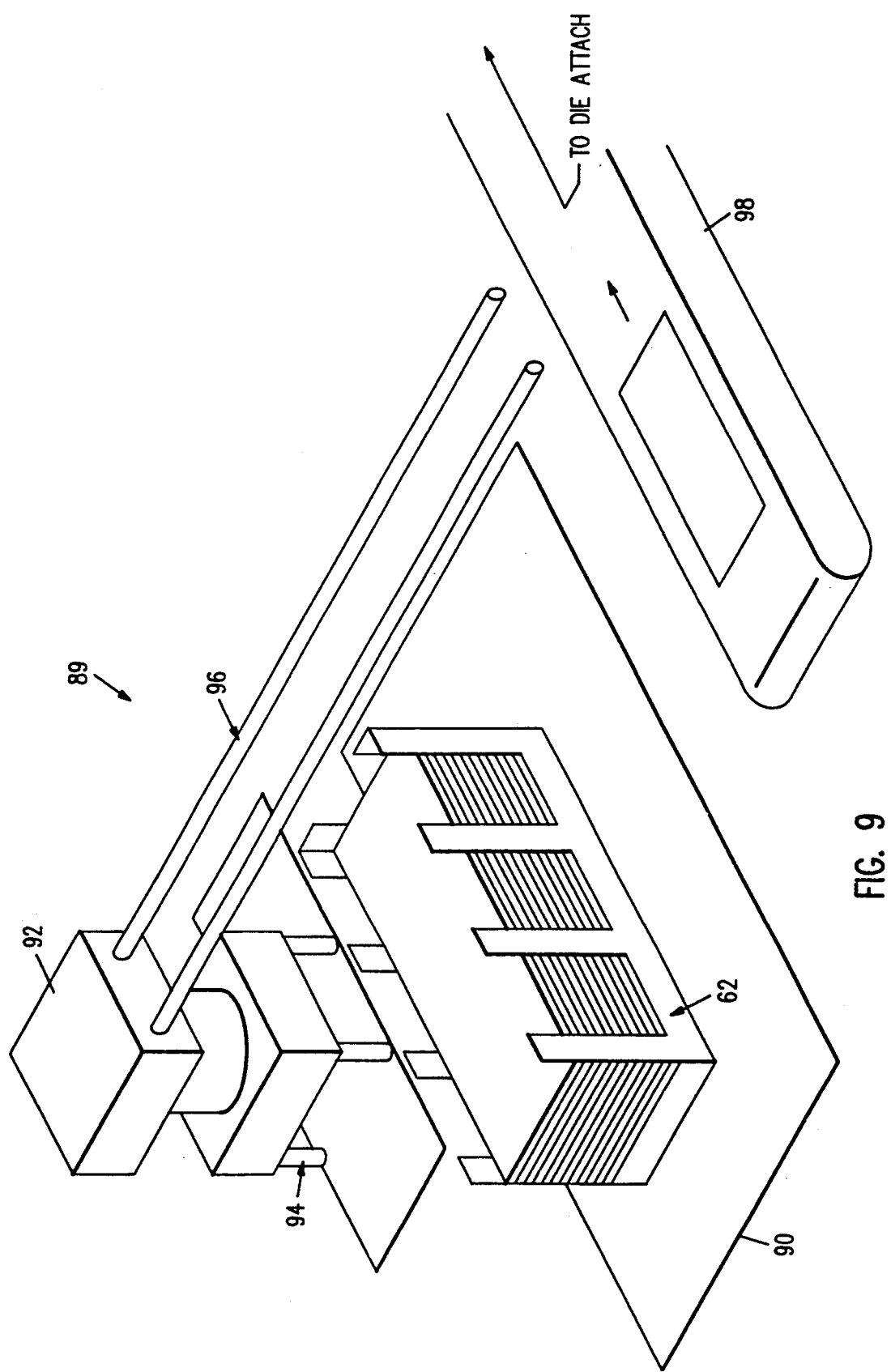
FIG. 9 is a perspective view of a loading device which automatically loads discrete strips 10 from the magazine to a packaging machine.

Referring to FIG. 9, a perspective view of a loading device which automatically loads discrete strips 10 from the magazine to a packaging machine is shown. The loading machine 89 includes a platform 90 for supporting the magazine 62, a moving head assembly 92 with a plurality of vacuum pick up members 94, two rods 96, and a conveyer belt 98. At the packaging facility, the cover 64 is removed and the magazine 62 is placed on platform 90. During operation of the loading machine 89, the vacuum pick up members 94 of the moving head assembly picks up a discrete strip 10 from magazine 62. The moving head assembly slides along rods 96 until the discrete strip 10 is positioned above conveyer 98. The discrete strip is then dropped onto the conveyer and the strip is conveyed to a packaging machine, such as a die attach.

The magazine 62 and cover 64 are manufactured using a custom mold injected process. The dimensions of the magazine and cover can be selected to accommodate any size or feature of a discrete strip 10. In a preferred embodiment, the magazine 62 and cover are made of a conductive material, such as 10% carbon fiber filled ABS, Noryl 4418 by General Electric Company, and carbon filled polystyrene. In alternative embodiments, the magazine and cover are made of an anti-static material such as ABS-SDB by General Electric.

The combination magazine and shipping tray of the present invention eliminates the problems associated with the prior art. Namely, it permits the automation of the loading and unloading of discrete strips of lead frames. Thus, the problems of contamination and physical damage to the lead frames, are eliminated.

Other embodiments of the invention will be apparent to those skilled in the art. It is intended that the specification be exemplary only, with the true scope and spirit of the invention being indicated by the claims.

What is claimed is:

1. A magazine utilizable for receiving discrete semiconductor lead frame strips from an inspection machine that is dispensing the lead frame strips, the magazine comprising:
   (a) a receptacle adapted for receiving a plurality of lead frame strips directly from an inspection machine via a conveyor, wherein the receptacle includes a base for supporting a received plurality of lead frame strips, a top with a top opening providing access therethrough, an end with an end opening providing access therethrough, and at least one side with a plurality of side openings providing access through each thereof, and wherein the at least one side comprises a plurality of posts extending from the base, each one of the plurality of posts includes a sloped region for guiding each one of a plurality of lead frame strips from an inspection machine into the receptacle; and
   (b) a removable cover adapted for placement on the receptacle for substantially covering a received plurality of lead frame strips by covering the top opening, the end opening and the plurality of side openings, wherein the removable cover includes a substantially planar top panel and a plurality of mutually abutting side panels in juxtaposition therewith;
   whereby the receptacle with the removable cover placed thereon forms a polyhedral enclosure which is utilizable for transport of a received plurality of lead frame strips to a preselected destination.

2. A magazine as in claim 1 wherein the base includes a recessed region formed therein for accommodating at least one die area of at least one of a received plurality of lead frame strips.

3. A magazine as in claim 1 wherein the base includes at least one pin hole formed therein which is adapted to receive a pin inserted therein.

4. A magazine as in claim 1 wherein both the receptacle and the removable cover comprise a conductive material.

5. A shipping package utilizable for loading discrete semiconductor lead frame strips into a packaging machine, the shipping package comprising:
   (a) a container adapted for transporting and loading a plurality of lead frame strips directly into a packaging machine, wherein the container includes a base for supporting a plurality of lead frame strips, a top with a top opening providing access therethrough, an end with an end opening providing access therethrough, and at least one side with a plurality of side openings providing access through each thereof, and wherein the at least one side comprises a plurality of posts extending from the base; and
   (b) a removable cover adapted for placement on the container for substantially covering a plurality of lead frame strips during transport thereof by covering the top opening, the end opening and the plurality of side openings, and which is removable for facilitating loading of a plurality of lead frame strips from the container into a packaging machine, wherein the removable cover includes a substantially planar top panel and a plurality of mutually abutting side panels in juxtaposition therewith;
   whereby the container with the removable cover placed thereon forms a polyhedral enclosure.

6. A shipping package as in claim 5 wherein the base includes a recessed region formed therein for accommodating at least one die area of at least one of a plurality of lead frame strips.

7. A shipping package as in claim 5 wherein the base includes at least one pin hole formed therein which is adapted to receive a pin inserted therein.

8. A shipping package as in claim 5 wherein both the container and the removable cover comprise a conductive material.

9. A magazine utilizable for receiving discrete semiconductor lead frame strips from an inspection machine that is dispensing the lead frame strips, the magazine comprising:
   (a) a receptacle adapted for receiving a plurality of lead frame strips directly from an inspection machine via a conveyor, wherein the receptacle includes:
      a top with a top opening providing access therethrough,
      an end with an end opening providing access therethrough,
      at least one side with a plurality of side openings providing access through each thereof, and
      a base supporting a received plurality of lead frame strips, wherein the base includes a recessed region formed therein for accommodating at least one die area of at least one of a received plurality of lead frame strips, and further includes at least one pin hole formed therein which is adapted to receive a pin inserted therein, and wherein the at least one side comprises a plurality of posts extending from the base, each one of the plurality of posts including a sloped region of guiding each one of a plurality of lead frame strips from a inspection machine into the receptacle; and
   (b) a removable cover adapted for placement on the receptacle for substantially covering a received plurality of lead frame strips by covering the top opening, the end opening and the plurality of side openings, wherein the removable cover includes a substantially planar top panel and a plurality of mutually abutting side panels in juxtaposition therewith;
   whereby the receptacle with the removable cover placed thereon forms a polyhedral enclosure which is utilizable for transport of a received plurality of lead frame strips to a preselected destination.

10. A magazine as in claim 9 wherein both the receptacle and the removable cover comprise a conductive material.

11. A shipping package utilizable for loading discrete semiconductor lead frame strips into a packaging machine, the shipping package comprising:
(a) a container adapted for transporting and loading a plurality of lead frame strips directly into a packaging machine, wherein the container includes:
a top with a top opening providing access therethrough,
an end with an end opening providing access therethrough,
at least one side with a plurality of side openings providing access through each thereof, and
a base supporting a plurality of lead frame strips, wherein the base includes a recessed region formed therein for accommodating at least one die area of at least one of a plurality of lead frame strips, and further includes at least one pin hole formed therein which is adapted to receive a pin inserted therein, and wherein the at least one side comprises a plurality of posts extending from the base; and
(b) a removable cover adapted for placement on the container for substantially covering a plurality of lead frame strips during transport thereof by covering the top opening, the end opening and the plurality of side openings, and which is removable for facilitating loading of a plurality of lead frame strips from the container into a packaging machine, wherein the removable cover includes a substantially planar top panel and a plurality of mutually abutting side panels in juxtaposition therewith;
whereby the container with the removable cover placed thereon forms a polyhedral enclosure.

12. A shipping package as in claim 11 wherein both the container and the removable cover comprise a conductive material.

* * * * *

UNITED STATES PATENT AND TRADEMARK OFFICE
CERTIFICATE OF CORRECTION

PATENT NO. : 5,310,055
DATED : MAY 10, 1994
INVENTOR(S) : HSIANG CHU

It is certified that error appears in the above-indentified patent and that said Letters Patent is hereby corrected as shown below:

In Col. 5, line 36, delete "includes" and replace with --including--.

In Col. 6, line 6, after "cover" insert --which is--.

In Col. 6, line 26, delete "container" and replace with --receptacle--.

In Col. 6, line 42, after "base" insert --for--.

In Col. 6, line 51, delete "region of" and replace with --region for--.

UNITED STATES PATENT AND TRADEMARK OFFICE
CERTIFICATE OF CORRECTION

PATENT NO. : 5,310,055
DATED : May 10, 1994
INVENTOR(S) : Hsiang Chu

It is certified that error appears in the above-indentified patent and that said Letters Patent is hereby corrected as shown below:

Col. 8, line 3, after "cover" insert --which is--.

Signed and Sealed this

Thirtieth Day of August, 1994

Attest:

BRUCE LEHMAN

Attesting Officer     *Commissioner of Patents and Trademarks*